United States Patent [19]

Hong

[11] Patent Number: 4,677,627

[45] Date of Patent: Jun. 30, 1987

[54] ERROR CORRECTION SCHEME

[75] Inventor: Ju-Hi J. Hong, Raleigh, N.C.

[73] Assignee: International Business Machines Corp., Armonk, N.Y.

[21] Appl. No.: 741,400

[22] Filed: Jun. 5, 1985

[51] Int. Cl.$^4$ ............................................. G06F 11/00
[52] U.S. Cl. ...................................... 371/57; 375/34; 375/57
[58] Field of Search ............... 371/57, 55, 56; 375/34, 375/57, 58, 19; 370/85, 86, 89

[56] References Cited

U.S. PATENT DOCUMENTS

| | | | |
|---|---|---|---|
| 4,482,999 | 11/1984 | Janson et al. | 370/86 |
| 4,507,777 | 3/1985 | Tucker et al. | 370/86 X |
| 4,549,292 | 10/1985 | Isaman et al. | 370/89 |
| 4,556,974 | 12/1985 | Kozlik | 370/89 |
| 4,566,097 | 1/1986 | Bederman | 370/89 |

OTHER PUBLICATIONS

Hardaker, EPROMS are the Building Blocks for Expandable Universal Timing Generator, ELECTRONIC DESIGN, vol. 27, No. 12, Jun. 7, 1979, p. 120.

Primary Examiner—Charles E. Atkinson
Attorney, Agent, or Firm—Joscelyn G. Cockburn

[57] ABSTRACT

An error correcting scheme for processing data which is transmitted on a broadband and/or CATV network and utilizes the IEEE 802.4 three-level duobinary AM/PSK (phase shift keying) coding format. The error correcting scheme utilizes two thresholders. One of the thresholders makes data (1 or 0) decisions while the other thresholder makes non-data or no non-data (non-data) decisions. Pattern matching and windowing are used to detect non-data symbols which are corrected if the non-data symbols deviate from a predetermined pattern. The template used in the pattern matching is determined from the state of a demodulator.

8 Claims, 11 Drawing Figures

ERROR CORRECTION SCHEME

BACKGROUND OF THE INVENTION

(1) Field of the Invention

The invention relates to the detection and correction of errors in information processing and, more particularly, to detection and correction of errors in signals transmitted on a broadband network utilizing a three-level duobinary AM/PSK coding format.

(2) Prior Art

Error detecting and correcting techniques for processing information are well known in the prior art. Most error detecting and correcting techniques are directly related to the type of coding technique used to handle the data. U.S. Pat. No. 4,118,686 describes an isolated (single) error correction scheme for processing data that is coded with a modified duobinary code. The error detection technique uses the special properties associated with this specific code to identify and correct an error. Error correction is predicated on the concept of maximum likelihood of error for the bit having the maximum amplitude variation from the corresponding nominal amplitude level.

U.S. Pat. No. 3,418,631 described an error detection technique for information coded with a paired selected ternary (PST) code. In particular, the technique detects transmission errors that introduce a non-zero DC component. The non-zero DC component may cause a serious problem if accumulated over a tandem connection of many transmission channels which cannot transmit DC or low frequency components of a signal. Specific properties of the PST code are utilized to identify the unwanted condition. The detected error bits are replaced with a unique code having no DC component. The frequency of occurrence of this code is used to monitor the status of each link in tandem connection.

U.S. Pat. No. 4,276,649 describes a technique for minimizing the noise due to transmission errors in digitized voice systems. The technique is especially effective for delta modulation systems. This is done by detecting the error in the form of code violations in bipolar coded signals (alternate mark inversion code) and generating idle channel noise when error is detected.

U.S. Pat. No. 3,866,147 describes a technique for implementing a correlated ternary code. The code is claimed to have a power spectral density similar to a duobinary code but has more data transitions which can be used for clock recovery in the receiver. Error detection is based on the specific properties of the code.

Recently, the IEEE Local Area Network (Project 802.4) has proposed new standards for allowing a token passing multiple access scheme on a broadband network. The scheme uses duobinary AM/PSK modulation to achieve 5 Mb/sec data rate in a 6 MHz channel. A ternary signaling convention is proposed. Compared with a binary signaling format, ternary signaling format is more susceptible to noise. In terms of a bit error rate (BER) versus signal-to-noise ratio (SNR), ternary signaling requires 6 dB higher signal-to-noise ratio compared with binary signaling. The higher SNR requirement raises a problem in that the system is more vulnerable to transmission errors caused by noise in the broadband network. (Note that in broadband network, the signal power cannot be increased beyond a certain maximum power level without affecting other signals sharing the broadband network).

SUMMARY OF THE INVENTION

It is therefore the main object of the present invention to provide a novel technique and apparatus for processing data transmitted in accordance with the above proposed standard. The novel technique provides a significant reduction in the SNR requirement.

The novel technique includes an error correction algorithm which is selectively applied to a data frame at the proposed physical (transmission) layer.

The apparatus includes two thresholding devices. One of the thresholding devices is used to make the normal data (1, 0) decision. The other thresholder is used to make non-data or code violation (CV) decision. The non-data decision includes CV and non-code violations ($\overline{CV}$). A correlation means is provided to examine the transmission packet outputted from the thresholders. Relying on certain characteristics of the code the algorithm in the correlation means searches for specific bit patterns (to be described later). The desired bit patterns, if present, can only be located in certain fields of the incoming packet. When the bit pattern is found in the predetermined field, the field is forwarded to a higher layer for further processing. If the bit pattern is not found due to transmission error, it is written into the known position of the field (error correction) and the field is then forwarded to the higher layer.

The foregoing features and other advantages of this invention will be more fully described in the accompanying description of the drawings.

DESCRIPTION OF THE PREFERRED EMBODIMENT

Figure 1:
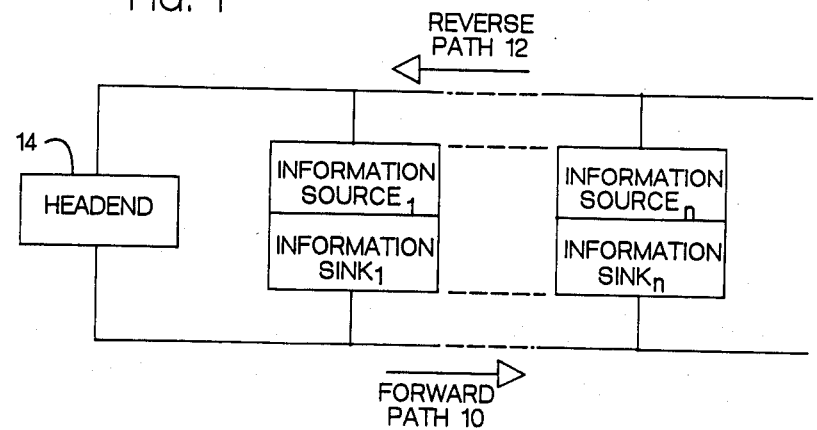
FIG. 1 shows a simplified conceptual broadband communications network in which the present invention can be used.

FIG. 1 shows a broadband or CATV communications network in which the present invention can be adapted. Broadband networks are designed primarily for analog video signal transmission, but can also be used to transmit data. The broadband network consists of a forward signal path 10, a reverse signal path 12 and a headend 14 interconnecting both paths. A plurality of information sources labeled $S_1$-$S_n$ are connected to the reverse path of the network. Likewise, a plurality of information sources labeled $sink_1$-$sink_n$ are connected to the sources and to the forward path 10 of the network. It is worthwhile noting that a broadband network provides a very large bandwidth (300–400 MHZ) which can be shared among many users and applications using, for example, frequency division multiplexing or any other conventional techniques.

To transmit data through a broadband network, the information source which may be a data terminal, a computer, etc. transmits data on the reverse path 12 to the headend 14. Usually, the data from the information source utilizes a digital format. The headend wraps the data around and retransmits the data on the forward path to the information sinks. The broadband network cannot handle the baseband digital formatted data directly and, therefore, it is necessary to modulate the baseband digital data from the information source into a radio frequency signal before it is transmitted on the reverse path. The selected radio frequency signal should lie within the passband of the reverse channel and forward channel. The information sinks demodulate the received RF signal back to baseband digital data and delivers it to the respective sinks.

Depending on the network configuration; the headend 14 may perform not only amplification but also frequency translation (for a single cable system), and/or remodulation where the received signal is demodulated to baseband digital signal and then modulated again. This approach provides a cleaner signal for the demodulators and establishes a central point where sophisticated network management functions can reside. The present invention (to be described subsequently) can be used with any headend configuration.

Figure 2:
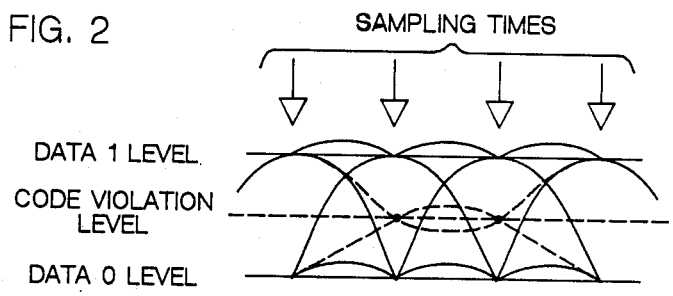
FIG. 2 shows a graph (eye diagram) for a demodulated 3-level AM/PSK signal format.

FIG. 2 shows a demodulated signal eye diagram of a three-level AM/PSK signaling format. This is the signaling format which is used to carry data on the broadband network of FIG. 1. The eye diagram has specific sampling times identified by the arrows pointing downwards. The diagram also has a data 1 level, a code violation level, and a data 0 level. Data 1 level and data 0 level are dedicated for carrying data 1 and 0, respectively. Similarly, the code violation level positioned midway of data 1 and 0 levels is used for carrying code violations. As stated above, this code violation is often referred to as the non-data information.

Figure 7A:
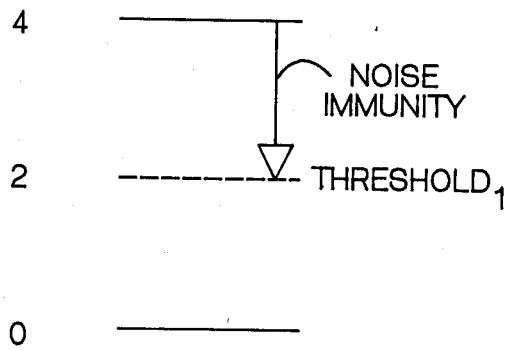
FIGS. 7A and 7B show a graphical representation for nominal signal levels and threshold voltages for binary and ternary signaling formats.
Figure 7B:
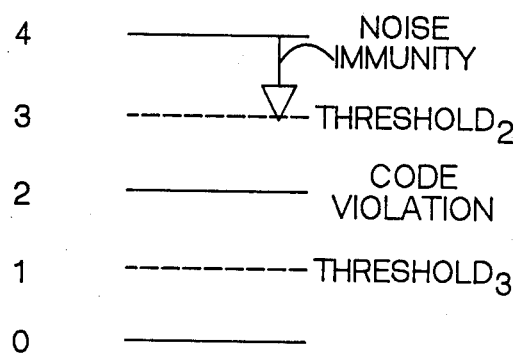

FIGS. 7A and 7B show two graphical representations of a binary signaling and ternary signaling format. In the proposed ternary signaling format (FIG. 7B), the amplitude of the carrier has three possible levels which are designated as 0, 2, and 4. The baseband digital symbol set has three signal elements; that is, data 1, data 0 or simply, 0, 1 and non-data. The symbols data 0 and data 1 are amplitude modulated to 0 and 4 carrier amplitudes, respectively, except for a special case which will be discussed later. The non-data symbols are always amplitude modulated to (2) carrier amplitude. In addition, non-data symbols always occur in pairs which is an inherent characteristic of the duobinary signaling method.

In the proposed physical layer standard, the non-data symbols are used to indicate frame delimiters and to break up long sequences of identical data signals to keep the clock recovery circuit in the demodulator synchronized. The main advantage of this technique is its simplicity and higher transmission rate compared with other schemes employing no-data symbols such as bit stuffing, or n to (n+1) bit conversion. As pointed out above, the major disadvantage of this technique is the increased vulnerability to noise. A comparison of FIGS. 7A and 7B show that the noise immunity is reduced by one-half or approximately 6 dB when compared with a system having no non-data symbols.

The invention to be described subsequently accomplishes error correction by using the following apriori information and the occurrence of non-data symbols in the received signal.

1. Non-data symbols occur only rarely. They occur only in start delimiters (SDEL), end delimiters (EDEL), and to indicate a forced transition that breaks up two consecutive octets (1 octet=8 symbols) of the same symbol. The SDEL and EDEL will be described subsequently.

2. Non-data symbols always occur in pairs.

3. Once the octet synchronization is achieved by detecting an SDEL, the possible non-data positions in an octet are known.

Figure 3:
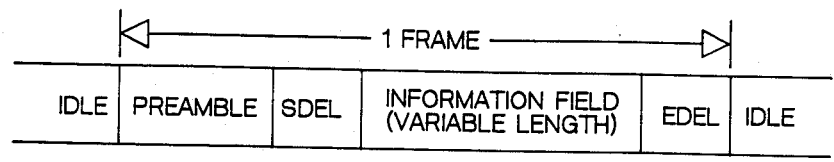
FIG. 3 shows a graph for the IEEE 802.4 token bus frame format.

FIG. 3 shows a graphical representation of the proposed frame format which will be used to transport data on the broadband network. The frame comprises a preamble field, a SDEL field, an information field, an EDEL field. Successive frames are separated by idle patterns. As stated before, the non-data symbols which are transmitted within a frame are placed in the SDEL and/or EDEL fields. By monitoring the incoming data to determine the presence of code violation in these fields, the demodulator can easily perform error correction if the expected code violations are not included in a received message.

Figure 4:
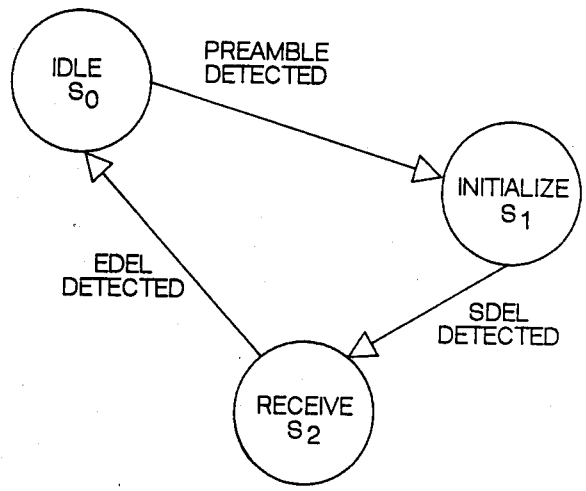
FIG. 4 shows a state diagram for a demodulator according to the teachings of the present invention.

Turning to FIG. 4 for a moment, a demodulator state diagram is shown. This diagram is helpful in understanding the various states that the demodulator goes through and the pattern it is searching for in each state. At the beginning of a cycle the modulator is in state $S_0$. This is an idle state, and the demodulator is looking for the preamble pattern. When the preamble is detected, the modulator moves into the initialization state ($S_1$). In state ($S_1$) the modulator is searching for the SDEL pattern. When the SDEL pattern is detected, the modulator moves into the receive state ($S_2$). In the receive state the modulator looks for the EDEL pattern. When that pattern is detected, the frame is completed and the demodulator moves back into the idle state.

Figure 5:
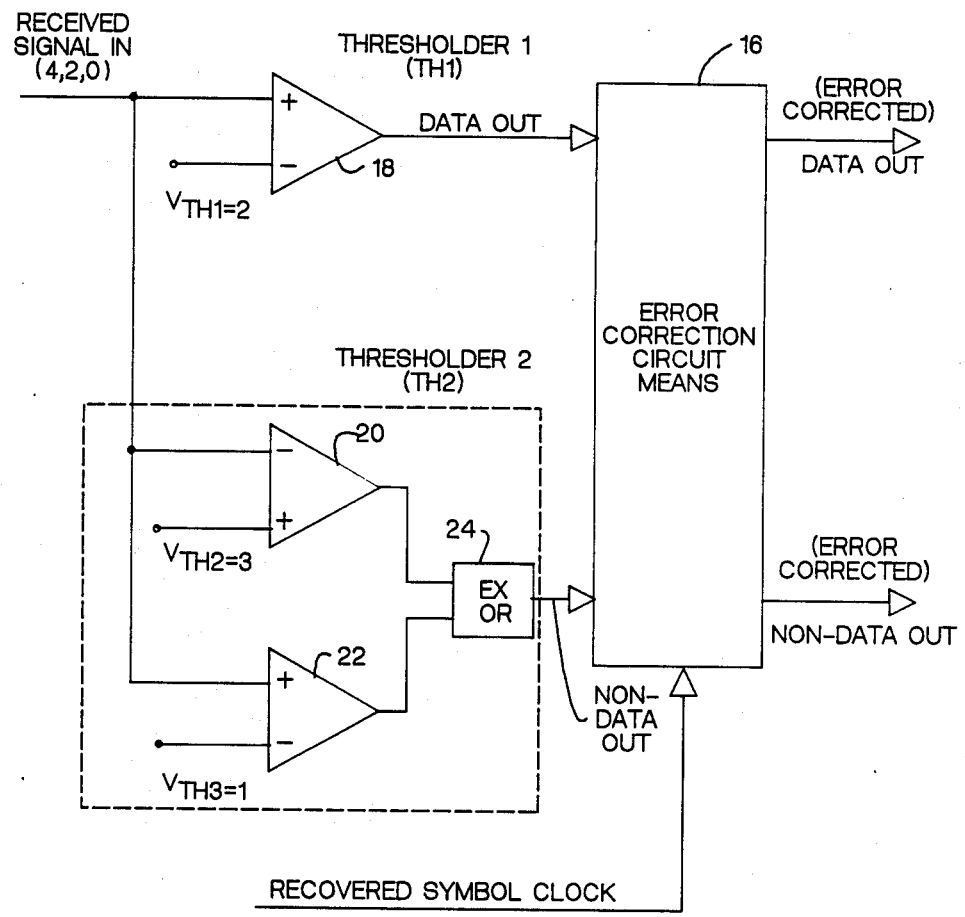
FIG. 5 shows the error correcting circuit arrangement according to the teaching of the present invention.
Figures 6, 6A:
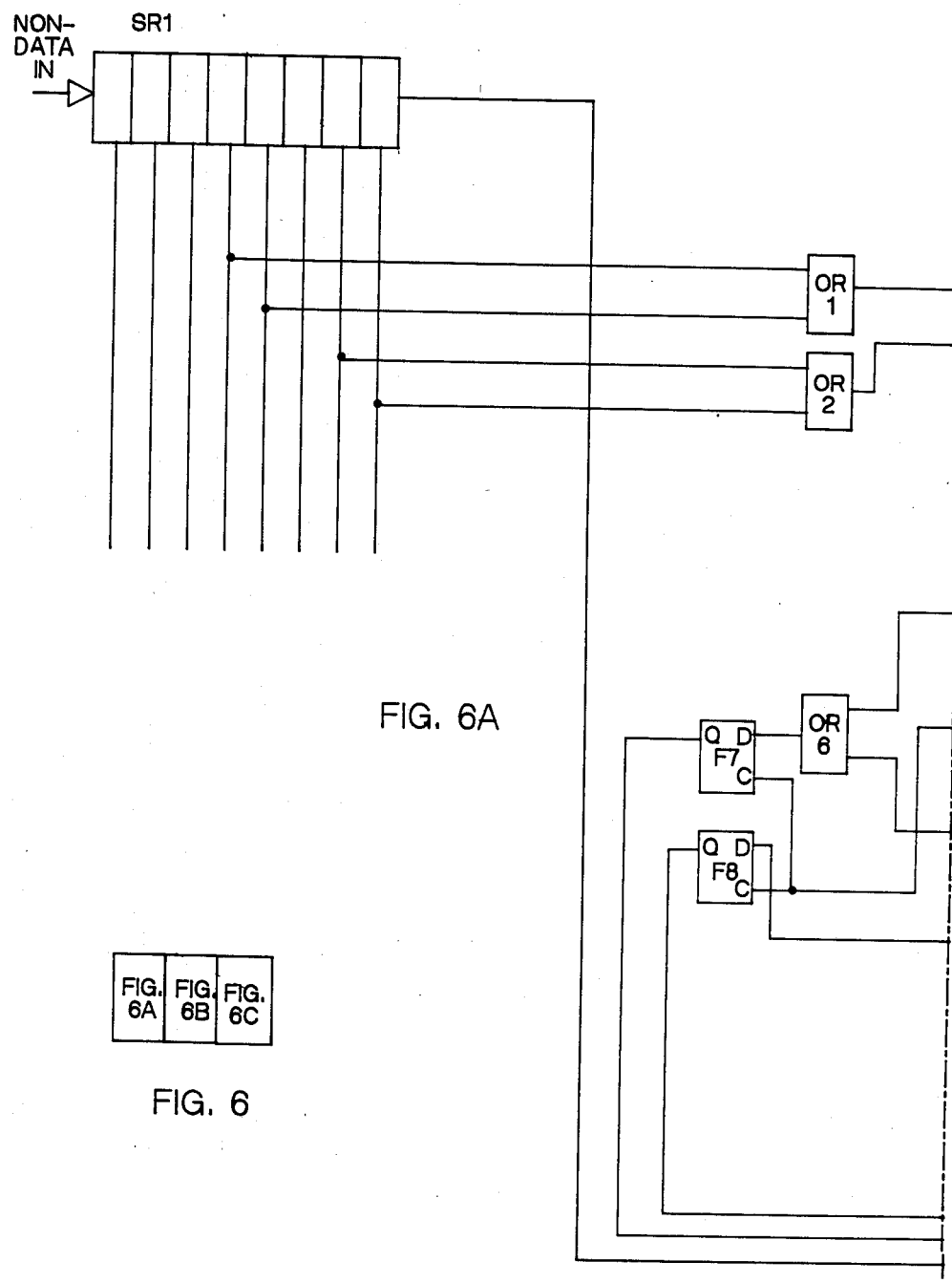
FIGS. 6, 6A, 6B and 6C show a hardward implementation for the error correcting scheme.
Figure 6B:
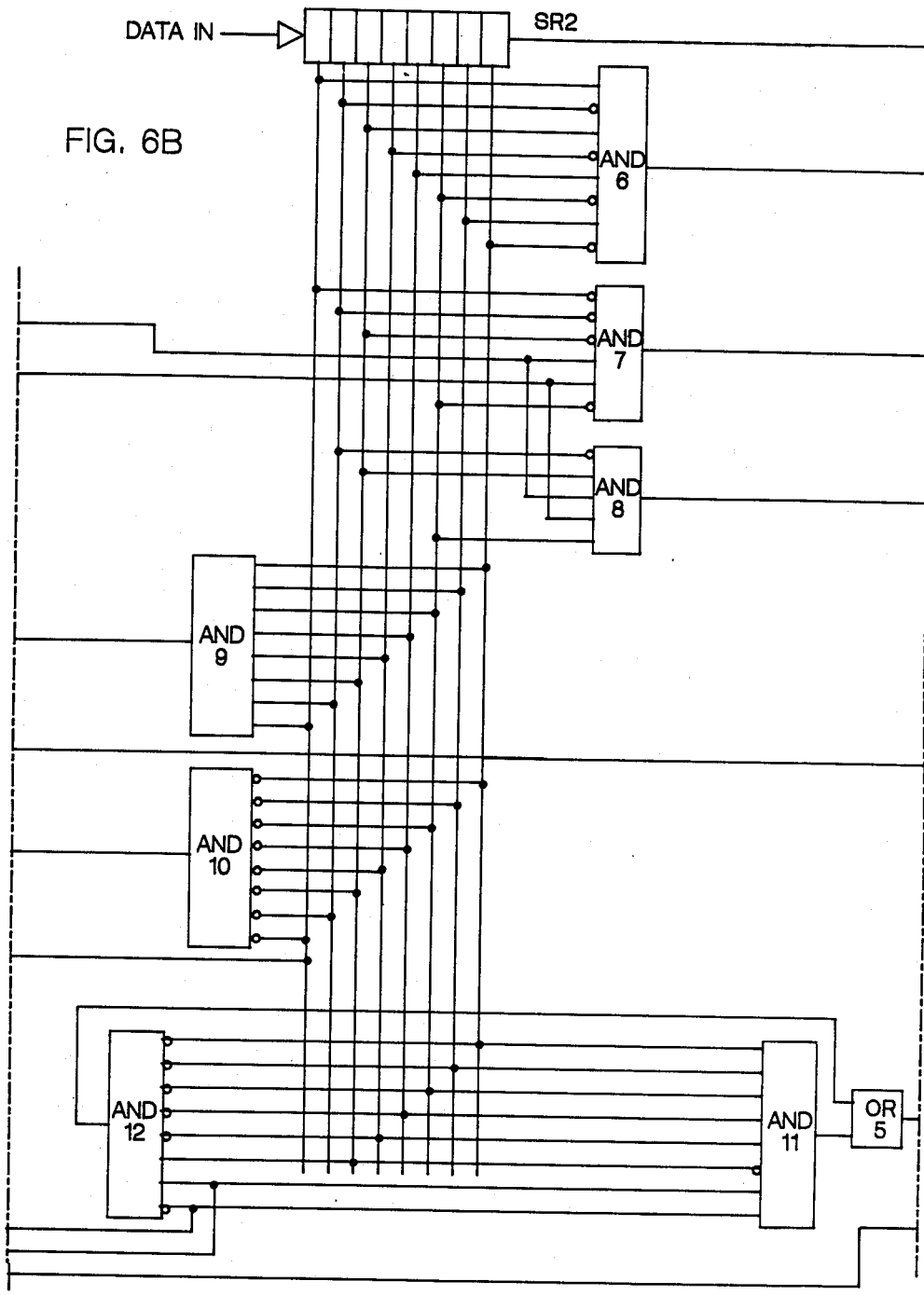
Figure 6C:
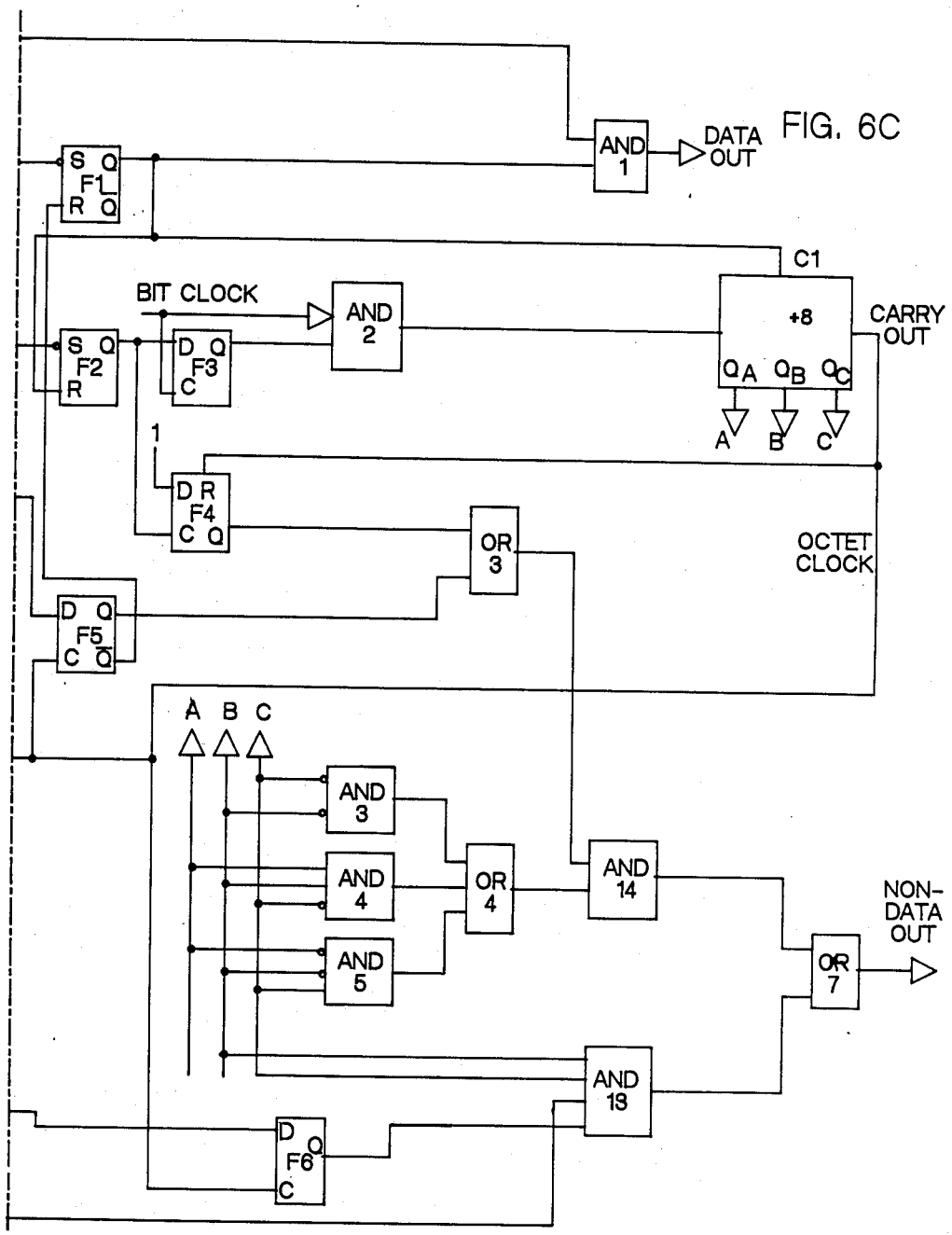

FIG. 5 shows a block diagram of the error correcting scheme according to the teaching of the present invention. The circuit arrangement includes two thresholders labeled thresholder 1 (TH1) and thresholder 2 (TH2). The thresholders output data and non-data, on separate conductors, to error detection/correction circuit means 16. Two signals identified as error corrected data out and error corrected non-data out are delivered to the previously described (medium access control) MAC layer. A signal called recovered symbol clock is extracted from the received frame and is supplied to the error correction circuit means 16. As stated before, with reference to FIGS. 7A and 7B, the signal which is received (labeled in FIG. 5 as received signal In may either be at a level 0, 2 or 4. The signal at levels 4 and 0 are data signals while the signal at level 2 represents non-data (that is, code violation, non-code violation) symbols.

The thresholder 1 (FIG. 5) includes comparator 18. The conductor labeled received signal In is tied to the positive input to the comparator and the negative input of the comparator is tied to VTH1=2. The thresholder 1 makes data 1 or data 0 decisions. The thresholder 2 (TH2) has two comparators identified by numerals 20 and 22, respectively. The output from the thresholders is fed into EXOR circuit means 24. The output from EXOR circuit means 24 provides the non-data signal that is supplied to the error correction circuit means 16. Comparator 20 has its negative terminal connected to Receive Signal In while the positive terminal is tied to threshold VTH2=3. Similarly, Comparator 22 has its positive terminal tied to the Receive Signal In and its negative terminal ties to threshold VTH3=1. It should be noted that the various threshold levels are chosen in accordance with the graphical representation shown in FIG. 7B.

As stated before, the function of thresholder 2 is to make non-data or no non-data decisions. It should be noted that the probability of error of thresholder 1 is the same as a binary system when symbol (0) or (4) is received. The probability of error of thresholder 2 is much higher and is independent of whether the received symbol is (0), (2), or (4). The error correction is done using pattern matching and windowing to detect non-data symbols and correcting them when necessary. As pointed out above in conjunction with the description of FIG. 4, the template used in the pattern matching is determined by the state of the demodulator.

FIGS. 6, 6A, 6B and 6C show one embodiment of the error correction circuit means 16. The implementation in FIGS. 6, 6A, 6B and 6C does not preclude other equivalent implementations in hardware or software or in some combination of both. Suffice it to say that the error correction algorithm (to be described later) monitors the incoming data stream and depending upon the received pattern the demodulator makes changes or no changes to the received data which is subsequently transmitted up to the MAC layer. The hardware embodiment shown in FIGS. 6, 6A, 6B and 6C uses two 8-bit shift registers SR1 and SR2, one divided by 8 binary counters (C1), 8 flip-flops (either set/reset or D-type F1-F8), 13 AND gates, and 7 OR gate. The interconnection between the named circuit modules are clearly shown in the Figs. Since each of these items is clearly identified and the interconnection between each item is clearly shown in the figure, the remaining portion of this application will be devoted to how the system works rather than how it is connected relative to each part. It is believed that this approach will minimize the size and complexity of the application.

The outputs from the two thresholders (FIG. 5) are inputted into the shift registers as shown in FIGS. 6, 6A, 6B and 6C. During idle (that is, no packets are being received on the bus) F1, F2, and C1 are in a reset state. A reception of a burst of data starts by detecting a preamble. A preamble is a 32 symbol pattern of alternating 4 and 0 which is optimum for fast clock recovery and automatic gain control capture in the demodulator. In the present scheme a preamble is detected when an 8-bit sequence of alternating 4 Ands 0's are received as indicated by AND gate 6. The output of AND gate 6 is latched in F1 which in turn enables A1 so that received data symbols (labeled DATA OUT) are transferred to the next higher layer (that is, the medium access control, MAC, layer). After the preamble is detected, the error correction circuit starts searching for an SDEL.

The bit pattern for an SDEL is (non-data, non-data, 0, non-data, non-data, 0, 0, 0). The SDEL bit pattern may also be represented as (CV, CV, 0, CV, CV, 0, 0, 0) where CV represents code violation. In the last representation the non-data notation is replaced with code violation (CV) notation. An SDEL is detected if at least one symbol from each pair of non-data symbols is detected correctly and all other data signals are detected correctly. The probability of misses and false alarms of this procedure is as follows:

$$p_e(\text{miss}) \simeq 2 \cdot p \text{ (both symbols in a non-data pair are not detected)}$$
$$\simeq 2 \cdot p_{ecv}^2$$

$$p_e(\text{false alarm}) \simeq p \text{ (preamble is detected as } SDEL) =$$
$$p \text{ (two data 1's are detected as 0's)} =$$
$$p_{ed}^2 << p_e(\text{miss})$$

where $P_{ecv}$ is the probability of error of thresholder TH2 and $P_{ed}$ is the probability of error of thresholder TH1 respectively.

If we choose $P_e$ (miss) $\simeq 10^{-8}$, then we have $P_{ecv} \simeq 10^{-4}$ and the required SNR is decreased approximately by 4 dB. The theoretical BER vs. required SNR for the 2-level AM/PSK system is given in the appendix.

The above error probability (miss and false alarm in detecting an SDEL) should have a negligible impact on the system throughput performance since the shortest packet (token packet) has a couple hundred bits, and, therefore, the probability that the information field has at least one error is greater than $10^{-6}$, which is much larger than the probability of error in detecting an SDEL.

Still referring to FIGS. 6, 6A, 6B and 6C, the SDEL is detected by AND gate 7 which sets latch F2 which in turn sets F3. The output from F3 is gated by AND gate 2 and starts the binary counter C1. The carry output from C1 is now the octet clock. When a SDEL is detected, the correct non-data symbol pattern is sent to the MAC layer by the error correction circuit. This is done by finding the correct non-data symbol position in the SDEL octet field by decoding the binary counter output (A,B, and C with AND gates 3, 4, 5, and OR gate 4. A non-data symbol is sent to MAC layer at the correct positions in the octet through AND gate 14 and OR gate 7. Since the EDEL octet has non-data symbols in the same position as SDEL, the same decoding circuit is used in EDEL correction. F4 (FIG. 6C) ensures that only one SDEL non-data pattern is sent to the MAC layer during a burst.

The EDEL has (non-data, non-data, 1, non-data, non-data, 1, 0, X) bit pattern; where X denotes a don't care state. The EDEL is detected using the same algorithm used for the SDEL; that is, an EDEL is detected if at least one non-data symbol from each non-data pair is detected correctly with all data symbols detected without error. The probability of missed and false alarms for EDEL is as follows:

$$p_e(\text{miss}) \simeq 2 \cdot p_{ecv}^2$$
$$p_e(\text{false alarm}) \simeq p(2 \text{ data bits are detected as non-data's})$$
$$\simeq p_{ecv}^2$$

It should be noted that the probability of error in detecting an EDEL is about the same as that of an SDEL. With reference to FIGS. 6, 6A, 6B and 6C, and EDEL is detected by AND gate 8 and latched in F5 which enables And 14 so that the correct non-data pattern is sent to the MAC layer. An EDEL indicates the end of the current burst. After sending an EDEL to the MAC layer, the error correction circuit arrangement is reset to detect the next preamble and so forth. This is accomplished by resetting F5 after sending error corrected EDEL to the MAC layer which in turn resets F1 which resets F2 and C1 subsequently.

As was mentioned previously, non-data symbols are also used to indicate a fourth type of transition which is used to break up a long string of the same data symbols. When two successive octets have no transition, the last three symbols in the second octet are replaced by (transition, non-data, non-data) where transition indicates the complement symbol. The error correction circuit (FIGS. 6, 6A, 6B and 6C) searches for patterns with 13 same data symbols followed by a complement symbol aligned with an octet boundary. When such pattern is detected, the output of TH2 (non-data threshold) (FIG. 5) of the corresponding position (that is, the last two symbol positions) is sent to the MAC layer. The technique may be characterized as a moving window scheme where the window is being opened only when non-data signals are supposed to be in the transmitted frame.

The rule used to detect non-data symbols following a forced data transition is to require that both non-data symbols in the pair should be correctly detected. Then the conditional error probability on the condition of a single transition following 13 consecutive bit times of no transition are:

$$p(\text{miss}) = p(\text{at least one non-data is not detected})$$
$$\simeq p_{ecv}$$
$$p(\text{flase alarm}) = p(\text{two non-data's are detected falsely})$$
$$= p_{ecv}^2$$

The probability of an occurrence of such data pattern is small ($<10^{-5}$) since scrambling or randomizing of data symbols is required by the standard, and therefore, the impact of these error probabilities on the system performance is also negligible.

In FIGS. 6, 6A, 6B and 6C, AND gate 9 and AND gate 10 are used to detect octets having the same or identical symbols. When an octet is found to have all the same symbols, F7 is set and the symbol type is latched in F8. When the next octet has the correct pattern, AND gate 11 or AND gate 12 is enabled which in turn enables AND gate 13 during the last two symbol positions of the second octet and the corresponding non-data outputs are sent to the MAC layer. The above analysis clearly shows that the error correction method of the present invention provides octet error probability roughly equal to a 2-level system operating at $10^{-8}$ bit error rate with about 2 decibel (dB) increase in signal-to-noise ratio rather than 6 decibels.

The error correction algorithm, according to the teaching of the present invention, may be summarized in the following steps:

Step 1: Monitor contiguous 8-bits of the output of thresholder 1, data thresholder, FIGS. 6, 6A, 6B and 6C until a preamble is received. A valid preamble has the sequence of (4,0,4,0,4,0,4,0,).

Step 2: Upon detecting a preamble, look for a start delimiter (SDEL) by monitoring contiguous 8-bits of the outputs from thresholder 1 (data thresholder) and thresholder 2 (non-data thresholder) simultaneously. The error-free SDEL is a sequence (CV, CV, 0, CV, CV, 0 0 0). A valid SDEL is detected if the output from thresholder 1 has the sequence (X,X,0,X,X,0,0,0) and the output of thresholder 2 has at least one (1) in each pair of CV positions, that is, in bit position (0, 1) and (3, 4). There are a total of nine valid sequences. X indicates a don't care state.

Step 3: Upon detecting a valid SDEL, the octet clock (C1) is started. The SDEL is sent to the MAC layer after error correction (if necessary). From this point on we look for an end delimiter (EDEL) and data pattern which has no transition in two consecutive octets. This is done as follows:

To detect the EDEL, monitor successive octets from thresholder 1 and thresholder 2 simultaneously. The same algorithm used in detecting the SDEL is used except that the valid bit sequence from a thresholder 1 is (X,X,1,X,X,1,0,X). When a valid EDEL is detected, the MAC layer is notified by sending the correct EDEL.

When two consecutive octets having no transition in the first 13-bit position is followed by a transition, in the fourteenth position the output of thresholder 2 is examined. If the last two bits of the octet from thresholder 2 are (1,1), then the present octet is assumed to have no transitions and the output from thresholder 1 will be modified before being sent to the MAC layer. Otherwise, the output from thresholder 1 is sent without modification.

By using the above invention, the required signal-to-noise ratio of the transmitted data is significantly reduced.

While the invention has been particularly shown and described with reference to a preferred embodiment thereof, it will be understood by those skilled in the art that various changes in form and details may be made therein without departing from the spirit and scope of the invention.

Having thus described my invention, what I claim as new, and desire to secure by Letters Patent is:

1. A method for processing data transmitted on a broadband and/or CATV network and utilizing a three-level duobinary AM/PSK signaling technique comprising the steps of:
   (a) generating a first stream of electrical signals representing transmitted data;
   (b) generating a second stream of electrical signals representing transmitted code violation (CV) and-/or non-code violation ($\overline{CV}$) information;
   (c) analyzing the electrical signals to identify a first predetermined bit pattern representing a field within an information frame;
   (d) analyzing the electrical signals to identify a second predetermined bit pattern representing a field within said information frame;
   (e) searching the second predetermined bit pattern for a predetermined number of occurrences of a special character set contained in said second predetermined bit pattern; and
   (f) sending said second predetermined bit pattern as a special control field to the next layer of a layered architecture only if the predetermined number of occurrences of said special character set is being found in the second predetermined bit pattern.

2. The method set forth in claim 1 further including the steps of adjusting the second predetermined bit pattern prior to sending it to the next layer of the layered architecture, only if a single occurrence of each of the special character set is being detected in predetermined bit positions.

3. The method set forth in claim 2 wherein the adjusting step further includes forcing another occurrence of the special character set adjacent to the single occurrence of said special character set so that the second predetermined bit pattern includes two pairs of the special character set.

4. The method set forth in claim 1 further including the steps of:
  (a) identifying octet boundaries within the electrical signals generated in step and step;
  (b) examining the group of signals between consecutive octet boundaries for determining a third predetermined sequence of bit pattern representing a third field within the information frame;
  (c) searching the third predetermined sequence of bits for a predetermined number of occurrences of a special character set; and
  (d) sending the third predetermined sequence of bits to the next layer of the layered architecture only if the predetermined number of occurrences of the special character set is being found in the third bit pattern.

5. The method set forth in claim 4 further including the steps of adjusting the third predetermined bit pattern prior to sending it to the other layer, only if a single occurrence of the special character set is being detected in predetermined bit positions.

6. The method set forth in claim 5 wherein the adjusting step further includes forcing another occurrence of the special character set in the bit position adjacent to the single occurrence of said special character set so that the third predetermined bit pattern includes two pairs of special character sets.

7. In a communications network wherein a 3-level AM/PSK signaling technique is being used for transporting information frames a device for correcting errors in said information frame comprising:
  (a) means for intercepting the information frames and operable for generating therefrom a first stream of electrical signals representing the data contents in said information frames and a second stream of electrical signals representing the non-data contents in said information frame; and
  (b) error correcting means operable for examining the streams of electrical signals for detecting a predetermined number of occurrences of a special character set and to adjust the bit contents of a particular field within said information frame only if a predetermined occurrence of the character set is being identified in particular bit positions of said streams of electrical signals.

8. A method for processing messages comprising the steps of:
  (a) intercepting the messages and generating therefrom a first stream of electrical signals representing the data contents in said messages and a second steam of electrical signals representing non-data contents in said messages;
  (b) analyzing the streams of electrical signals to detect a predetermined bit pattern representing a particular field within said messages;
  (c) searching the particular field to identify a number of occurrences of a special character set within said particular field; and
  (d) adjusting the contents of said particular field only if the number of occurrences of said character set is less than a predetermined number.

* * * * *